(12) United States Patent
Eid et al.

(10) Patent No.: US 12,532,740 B2
(45) Date of Patent: Jan. 20, 2026

(54) POROUS MESH STRUCTURES FOR THE THERMAL MANAGEMENT OF INTEGRATED CIRCUIT DEVICES

(71) Applicant: Intel Corporation, Santa Clara, CA (US)

(72) Inventors: Feras Eid, Chandler, AZ (US); Wenhao Li, Chandler, AZ (US); Paul Diglio, Gaston, OR (US); Xavier Brun, Hillsboro, OR (US); Johanna Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 785 days.

(21) Appl. No.: 17/709,064

(22) Filed: Mar. 30, 2022

(65) Prior Publication Data
US 2023/0317549 A1    Oct. 5, 2023

(51) Int. Cl.
*H01L 23/373*    (2006.01)
*H01L 21/48*    (2006.01)

(52) U.S. Cl.
CPC ...... *H01L 23/3733* (2013.01); *H01L 21/4871* (2013.01)

(58) Field of Classification Search
None
See application file for complete search history.

(56) References Cited

U.S. PATENT DOCUMENTS

| | | | |
|---|---|---|---|
| 2020/0006187 A1* | 1/2020 | Otremba | H01L 23/3675 |
| 2020/0080792 A1* | 3/2020 | Hirono | H01L 23/427 |
| 2021/0159143 A1* | 5/2021 | Joshi | C25D 5/022 |
| 2021/0233832 A1* | 7/2021 | Uppal | H01L 23/3737 |
| 2021/0407877 A1* | 12/2021 | Eid | H01L 23/562 |

* cited by examiner

Primary Examiner — Benjamin P Sandvik
(74) Attorney, Agent, or Firm — Essential Patents Group, LLP (57) ABSTRACT

A porous mesh structure for use in the thermal management of integrated circuit devices may be formed as a solid matrix with a plurality of pores dispersed therein, wherein the solid matrix may be a plurality of fused matrix material particles and the plurality of pores may comprise between about 10% and 90% of a volume of the porous mesh structure. The porous mesh structure may be formed on an integrated circuit device and/or on a heat dissipation assembly component, and may be incorporated into an immersion cooling assembly, wherein the porous mesh structure may act as a nucleation site for a working fluid in the immersion cooling assembly.

20 Claims, 9 Drawing Sheets

POROUS MESH STRUCTURES FOR THE THERMAL MANAGEMENT OF INTEGRATED CIRCUIT DEVICES

TECHNICAL FIELD

Embodiments of the present description generally relate to the field of thermal management for integrated circuit devices, and, more specifically, to porous mesh structures formed on substrates for dissipating heat from integrated circuit devices.

BACKGROUND

The integrated circuit industry is continually striving to produce ever faster, smaller, and thinner integrated circuit devices and packages for use in various electronic products, including, but not limited to, computer servers and portable products, such as portable computers, electronic tablets, cellular phones, digital cameras, and the like.

As these goals are achieved, the integrated circuit devices become smaller. Accordingly, the density of power consumption of electronic components within the integrated circuit devices has increased, which, in turn, increases the average junction temperature of the integrated circuit device. If the temperature of the integrated circuit device becomes too high, the integrated circuits may be damaged or destroyed. Thus, heat dissipation devices are used to remove heat from the integrated circuit devices in an integrated circuit package. In one example, heat spreading and dissipation devices may be thermally attached to integrated circuit devices for heat removal. The heat spreading and dissipation devices, in turn, dissipate the heat into the surrounding atmosphere. In another example, a cooling device, such as a heat exchanger or a heat pipe, may be thermally attached to integrated circuit devices for heat removal. However, as power densities and power envelopes increase to reach peak performance, these methods are becoming ineffective in removing sufficient heat.

One emerging heat removal technique is two-phase immersion cooling. This technique essentially comprises immersing an integrated circuit assembly into a liquid cooling bath containing a low boiling point liquid which vaporizes and, thus, cooling the integrated circuit assembly through latent heat transfer, as the integrated circuit assembly generates heat. Although it is a promising technology, two-phase immersion cooling has various challenges for effective operation, as will be understood to those skilled in the art.

For example, in one embodiment of a two-phase immersion cooling assembly, a support substrate, such as a copper block, having a first surface and an opposing second surface, may have a boiling enhancement structure, such as porous structures (e.g., multi-layer meshing or metal foam), on the first surface and may have the second surface in thermal contact with the heat dissipation device or to an integrated circuit device by a thermal interface material layer, such as an indium/aluminum foil. However, the thermal interface material layer may contribute to the thermal resistance of the assembly, which may result in the assembly being incapable of removing a sufficient amount of heat.

Thus, there is an on-going effort to improve the operation and efficiency of thermal dissipation systems, such as two-phase immersion cooling assemblies.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to porous mesh structures for use in the thermal management of integrated circuit devices. In an embodiment of the present description, the porous mesh structure may comprise a solid matrix with a plurality of pores dispersed therein. In one embodiment of the present description, the solid matrix may comprise a plurality of fused matrix material particles and the plurality of pores may comprise between about 10% and 90% of the volume of the porous mesh structure. In another embodiment of the present description, the pores of the porous mesh structures may have an average diameter of between about 10 and 500 microns. In various embodiments of the present description, the porous mesh structure may be formed on an integrated circuit device and/or on a heat dissipation assembly component. In still further embodiments of the present description, the porous mesh structure may be incorporated into an immersion cooling assembly.

Figure 1:
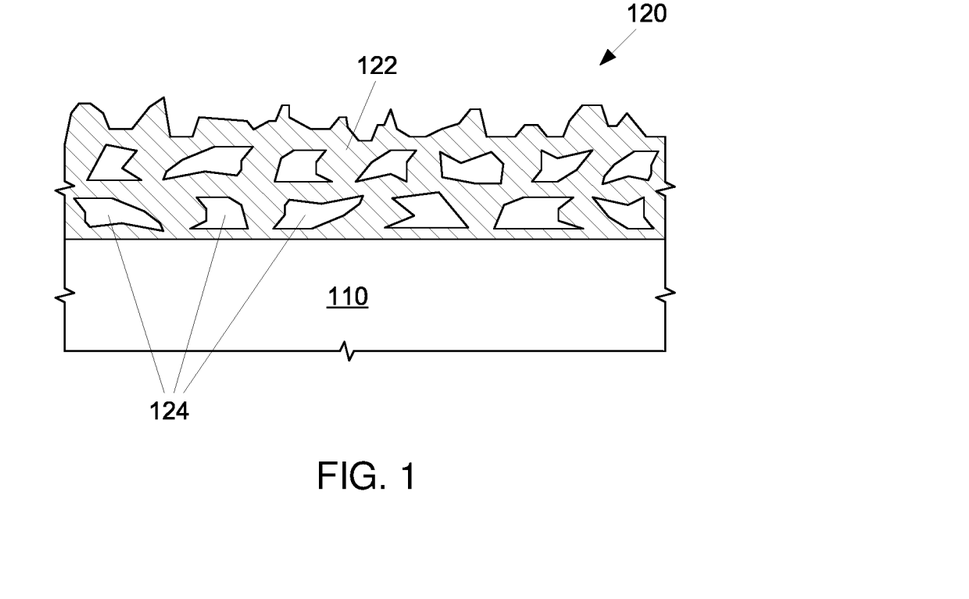
FIG. 1 is a side cross-sectional view of a porous mesh structure on a substrate, according to an embodiment of the present description.

As shown in FIG. 1, in one embodiment of the present description, a porous mesh structure 120 may be formed on a substrate 110. The porous mesh structure 120 may comprise a solid matrix 122 with a plurality of pores 124 dispersed in the solid matrix 122. In one embodiment of the present description, the solid matrix 122 may comprise any appropriate material, including, but not limited to copper, aluminum, nickel, carbon (such as diamond and graphite), silicon carbide, aluminum nitride, combinations thereof, combinations with other materials, and the like. In an embodiment of the present description, the plurality of pores 124 may be "open cell", i.e., predominately open to atmosphere. Although the plurality of pores 124 may be irregular in shape, in one embodiment of the present description, the plurality of pores 124 may have an average diameter or dimension of between about 10 and 500 microns. In an embodiment of the present description, the plurality of pores 124 may comprise between about 10% and 90% of a volume of the porous mesh structure 120. The substrate 110 may be any appropriate structure, including, an integrated circuit device, an encapsulant material, a mold material, a heat sink, a heat pipe, an integrated heat spreader (lid), or the like, as will be discussed.

Figure 2:
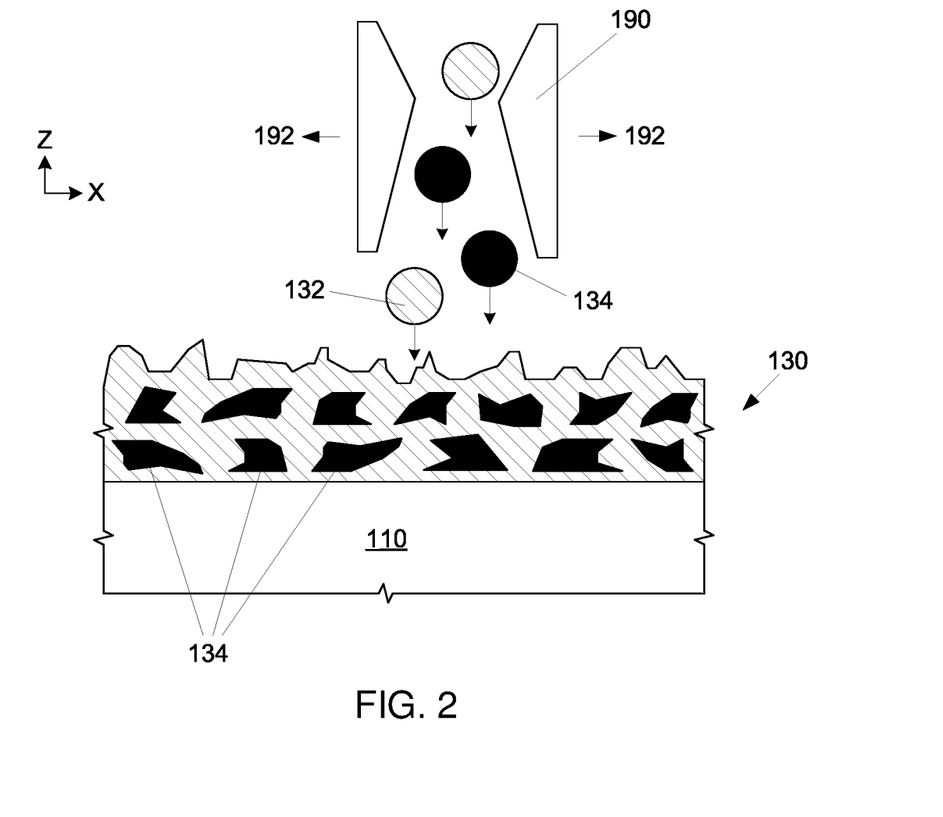
FIGS. 2-4 are side cross-sectional views of a process of forming a porous mesh structure on a substrate, according to an embodiment of the present description.

As shown in FIG. 2, an intermediate matrix structure 130 may be formed on the substrate 110. The intermediate matrix structure 130 may be formed by an additive process, such as high throughput additive manufacturing ("HTAM"). In one embodiment, the intermediate matrix structure 130 may be formed with a "coldspray" HTAM process. As the coldspray process is known in the art, it will be only concisely discussed herein. With a coldspray process, solid powders of a desired material or materials, such as matrix material particles 132 and sacrificial material particles 134, to be deposited are accelerated in a carrier jet (e.g., compressed air or nitrogen) by passing the jet through a converging diverging nozzle 190. The jet exits the nozzle 190 at a high velocity and reaches the underlying substrate 110, where the impact causes the matrix material particles 132 and/or the sacrificial material particles 134 in the jet to plastically deform and bond or fuse to the substrate 110. Subsequent layers of the matrix material particles 132 and/or the sacrificial material particles 134 similarly adhere or fuse to each underlying layer upon continued jet impact, producing fast buildup (e.g., layers that are a few hundred microns thick can be deposited over an area of about 100-1000 mm² in a few seconds). The nozzle 190 may be moved (shown as arrows 192) across the substrate 110 during the spray process. Moreover, unlike thermal spraying techniques, this approach does not require melting the particles (e.g., the matrix material particles 132 and/or the sacrificial material particles 134), thus protecting both the materials and the substrate 110 from experiencing excessive processing temperatures. In one embodiment of the present description, the intermediate matrix structure 130 may be formed at a temperature below about 150 degrees Celsius. Because additive manufacturing, such as coldspray, is used, it eliminates the need for using lithography and the many steps associated with it (resist deposition, exposure, resist development, and resist removal) that are characteristic of subtractive or semi-additive methods, such as plating, sputtering, and the like. Additionally, 3D topography can be easily created, if needed, as will be understood to those skilled in the art. It is noted that stencils or masks can be used to specifically pattern the intermediate matrix structure 130, as will also be understood to those skilled in the art. It is further noted that the matrix material particles 132 may be a mixture of differing material particles.

Figure 3:
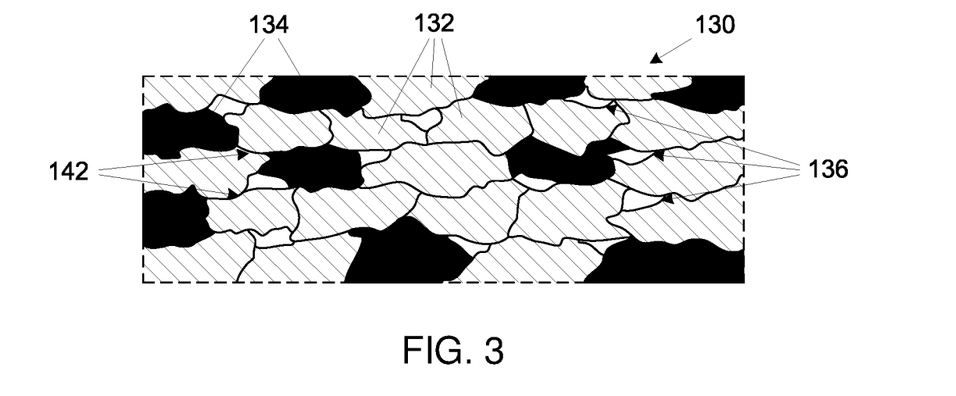

FIG. 3 further illustrates deposition of the matrix material particles 132 and the sacrificial material particles 134 to form the intermediate matrix structure 130, in accordance with some embodiments of the HTAM process, as previously discussed. As shown, the microstructure of the intermediate matrix structure 130 comprises deformed matrix material particles 132 fused to one another and layered in a lamellar structure/manner (e.g., forming the porous mesh structure 120 of FIG. 1), the sacrificial material particles 134 between the matrix material particles 132, and voids 136 (inherently formed during the deposition process and less than about 2% of the volume of the intermediate matrix structure 130). At sufficient magnification, fusion boundaries 142 between the matrix material particles 132 are apparent (e.g., the surfaces where the matrix material particles 132 fuse together), as distinguished from atomic deposition processes, such as plating. The lamellar structure of the matrix material particles 132 may be evident within the porous mesh structure 120 (see FIG. 1), which is indicative of the impact between the matrix material particles 132 and the foundation substrate 110 (see FIG. 2) and between the matrix material particles 132 and the previous deposited matrix material particles 132, where most of the matrix material particles 132 plastically deform and flatten.

Figure 4:
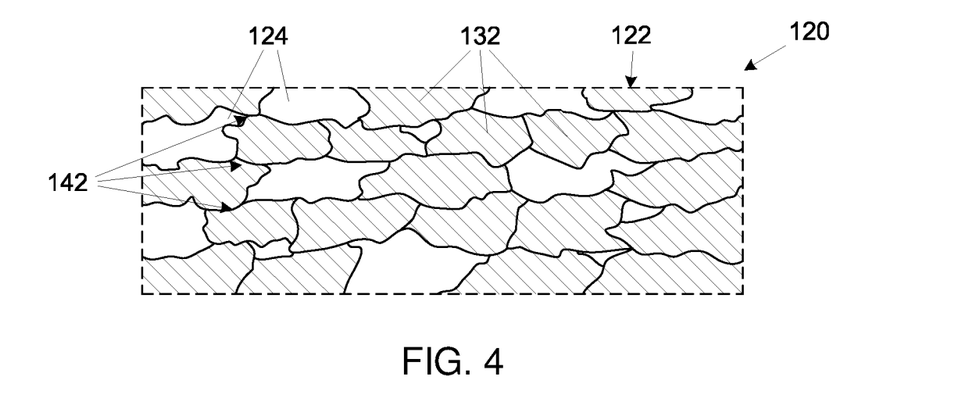

As shown in FIG. 4, after the formation of the intermediate material structure 130 (see FIG. 3), the sacrificial material particles 134 (see FIG. 3) may be removed to form the plurality of pores 124 and, likewise, the porous mesh structure 120 remains. As will be understood to those skilled in the art, the process of removal will depend on the materials used for the matrix material particles 132 and the sacrificial material particles 134 (see FIG. 3). The sacrificial material particles 134 (see FIG. 3) can be a metal or a polymer material that is different from the matrix material particles 132. The removal of the sacrificial material particles 134 (see FIG. 3) may be achieved with any appropriate process or processes, including, but not limited to, wet etching, dry etching, dissolution with water or other chemicals, thermal decomposition, and the like, so long as the process or processes do not significantly impact the matrix material particles 132 of the final porous mesh structure 120 or any electronic component present during the removal process. In one embodiment of the present description, the matrix material particles 132 may comprise copper and the sacrificial material particles 134 (see FIG. 3) may comprise aluminum, wherein the sacrificial material particles 134 (see FIG. 3) are removed by a wet etch that removes aluminum, but does not remove the copper matrix material particles 132. One example of such a wet etch is a dilute mixture of sodium hydroxide. In another embodiment of the present description, the sacrificial material particles 134 (see FIG. 3) may be a thermally decomposable material, such as a polymer, including, but not limited to polycarbonate, polynorbornene, polyaldehyde, or the like, wherein the sacrificial material particles 134 (see FIG. 3) are removed with heat for an appropriate duration of time. In one embodiment of the present description, the sacrificial material particles 134 (see FIG. 3) may be heated to a temperature of between about 50 and 300 degrees Celsius.

Figure 5:
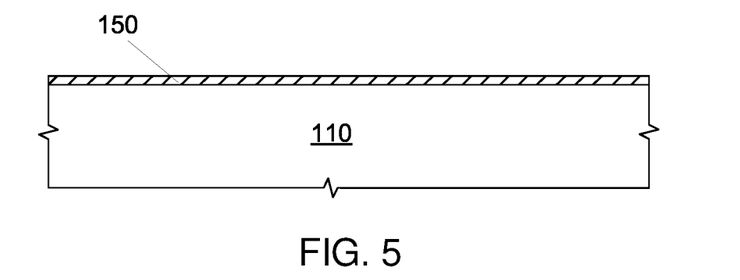
FIGS. 5-7 are side cross-sectional views of a process of forming a porous mesh structure on a substrate, according to another embodiment of the present description.
Figure 6:
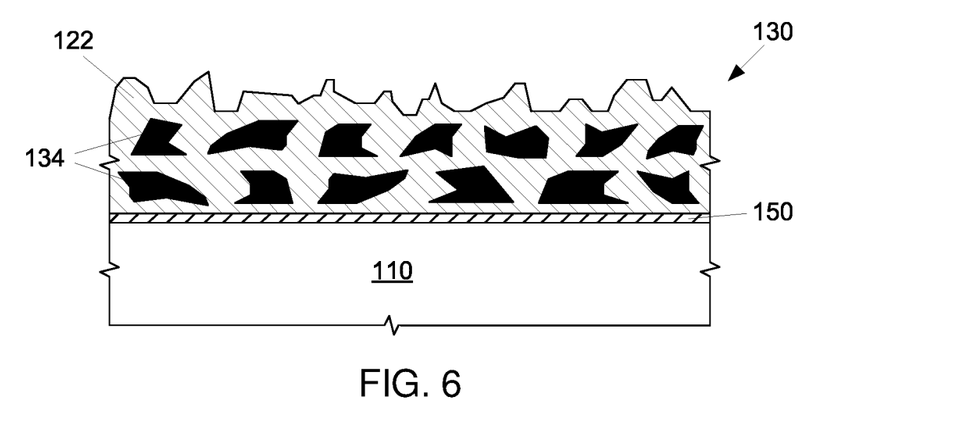
Figure 7:
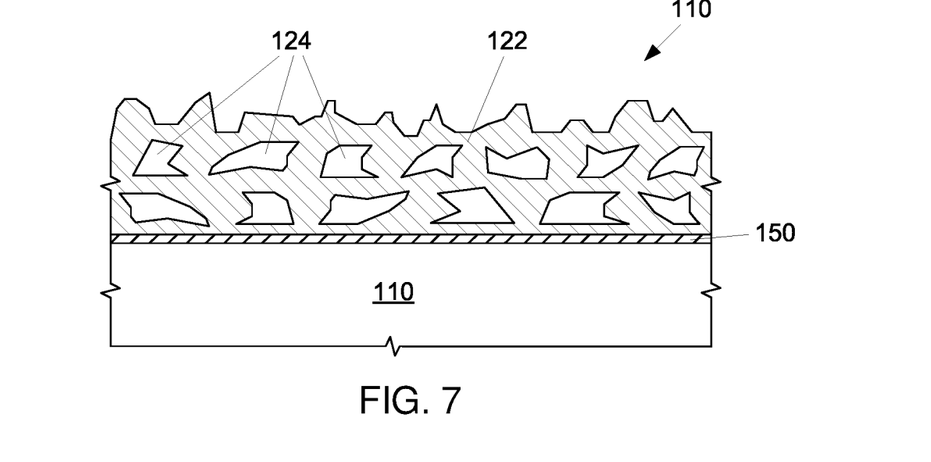

In one embodiment of the present description, the porous mesh structure 120 may be formed to directly contact the substrate 110, as shown in FIGS. 1 and 2. In other embodiments of the present description, at least one intermediate layer 150 may be formed on the substrate 110, as shown in FIG. 5, prior to the formation of the intermediate mesh structure 130 on the intermediate layer 150, as shown in FIG. 6. The intermediate layer 150 may be formed as a buffer layer to protect the substrate 110 from abrasion during deposition of the intermediate mesh structure 130, formed as a diffusion layer to prevent the materials of the intermediate mesh structure 130 from diffusing into the substrate 110, formed as an adhesion promotion layer, and/or formed for other purposes. Although the intermediate layer 150 is illustrated as a single layer in FIG. 5, it is understood that the intermediate layer 150 may consist of one or more layers of different materials. In one embodiment of the present description, the intermediate layer 150 may be any appropriate material, including, but not limited to, titanium, nickel, vanadium, gold, nitride materials, or combinations of those or other materials. In an embodiment of the present description, the intermediate layer 150 may be between about 10 and 500 nanometers. As shown in FIG. 6, the intermediate mesh structure 130 may be formed on the intermediate layer 150. As shown in FIG. 7, after the intermediate mesh structure 130 is formed (see FIG. 6), the sacrificial material particles 134 may be removed to form the porous mesh structure 120, as previously discussed with regard to FIG. 4.

Figure 8:
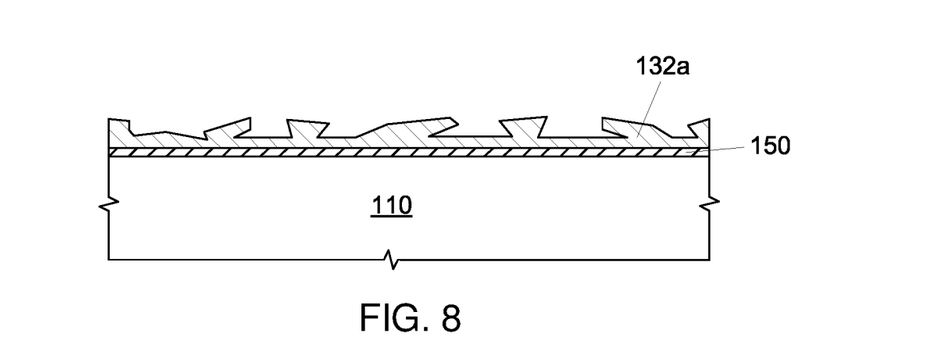
FIGS. 8-11 are side cross-sectional views of a process of forming a porous mesh structure on a substrate, according to still another embodiment of the present description.
Figure 9:
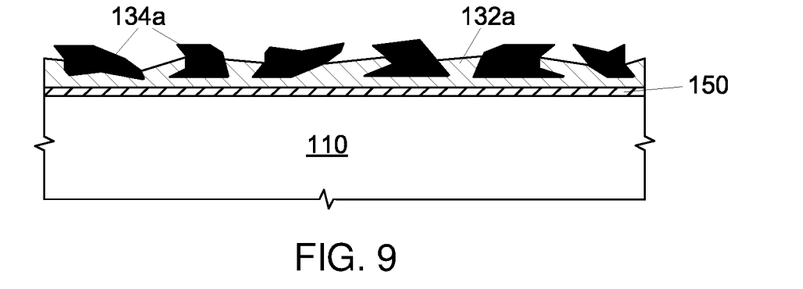
Figure 10:
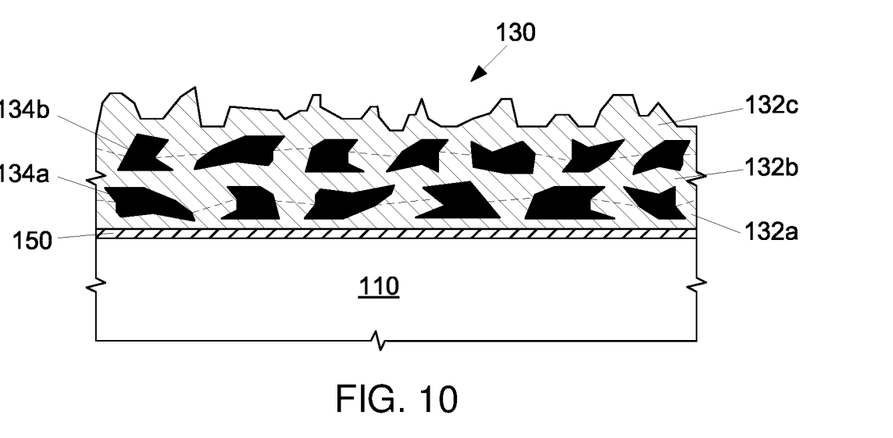
Figure 11:
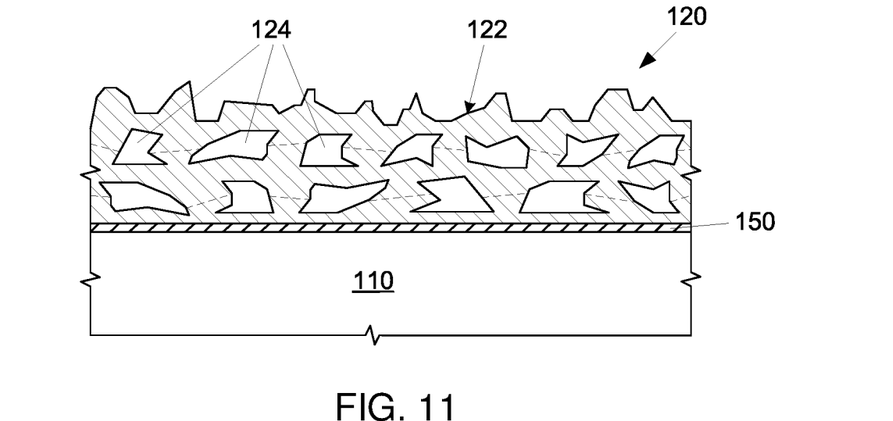

Although the embodiments illustrated in FIG. 1-7 primarily discuss the formation of the porous mesh structure 120 by co-deposition of the matrix material particles 132 and the sacrificial material particles 134, the embodiments of the present description are not so limited. As shown in FIG. 8, a first matrix material particle layer 132a may be formed on the intermediate layer 150. A first sacrificial material particle layer 134a may then be formed on the first matrix material particle layer 132a, as shown in FIG. 9. The steps of FIG. 8 and FIG. 9 may be sequentially repeated with a formation of a second matrix material particle layer 132b, a second sacrificial material particle layer 134b, and a third matrix material particle layer 132c, as shown in FIG. 10. The first sacrificial material particle layer 134a and the second sacrificial material particle layer 134b may be removed, as previously discussed, to form the porous mesh structure 120, as shown in FIG. 11.

Figure 12:
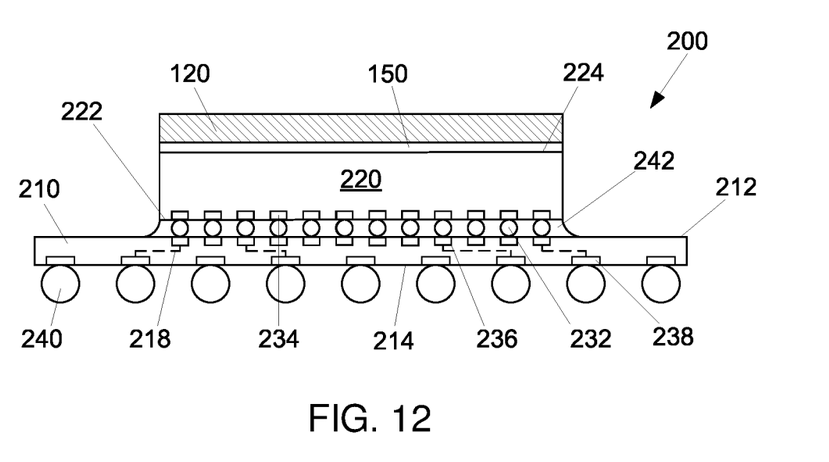
FIGS. 12-15 are side cross-sectional views of single-chip and multi-chip integrated circuit assemblies, according to various embodiments of the present description.

In various embodiments of the present description, the porous mesh structure 120 may be utilized in integrated circuit assemblies. FIG. 12 illustrates an integrated circuit assembly 200 having at least one integrated circuit device 220 electrically attached to an electronic substrate 210 in a configuration generally known as a flip-chip or controlled collapse chip connection ("C4") configuration, according to an embodiment of the present description. In one embodiment of the present description, the porous mesh structure 120 and the intermediate layer 150 of FIGS. 6-11 may be formed on a backside surface 224 of the integrated circuit device 220, wherein the integrated circuit device 220 is the substrate 110 of FIG. 1-11.

The electronic substrate 210 may be any appropriate structure, including, but not limited to, an interposer. The electronic substrate 210 may have a first surface 212 and an opposing second surface 214. The electronic substrate 210 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

The electronic substrate 210 may further include conductive routes 218 (shown in dashed lines) extending through the electronic substrate 210. As will be understood to those skilled in the art, the conductive routes 218 may be a combination of conductive traces (not shown) and conductive vias (not shown) extending through the plurality of dielectric material layers (not shown). These conductive traces and conductive vias are well known in the art and are not shown in FIG. 12 for purposes of clarity and conciseness. The conductive traces and the conductive vias may be made of any appropriate conductive material, including but not limited to, metals, such as copper, silver, nickel, gold, and aluminum, alloys thereof, and the like. As will be understood to those skilled in the art, the electronic substrate 210 may be a cored substrate or a coreless substrate. In one embodiment of the present description, the electronic substrate 210 may comprise a silicon or glass interposer. In another embodiment of the present description, the electronic substrate 210 may include active and/or passive devices.

The integrated circuit device 220 may be any appropriate device, including, but not limited to, a microprocessor, a chipset, a graphics device, a wireless device, a memory device, an application specific integrated circuit, combinations thereof, stacks thereof, or the like. As shown, the integrated circuit device 220 may have a frontside surface 222 that opposes the backside surface 224.

In an embodiment of the present description, the integrated circuit device 220 may be electrically attached to the electronic substrate 210 with a plurality of device-to-substrate interconnects 232. In one embodiment of the present description, the device-to-substrate interconnects 232 may extend between bond pads 236 on the first surface 212 of the electronic substrate 210 and bond pads 234 on the frontside surface 222 of the integrated circuit device 220. The device-to-substrate interconnects 232 may be any appropriate electrically conductive material or structure, including, but not limited to, solder balls, metal bumps or pillars, metal filled epoxies, or a combination thereof. In one embodiment, the device-to-substrate interconnects 232 may be solder balls formed from tin, lead/tin alloys (for example, 63% tin/37% lead solder), and high tin content alloys (e.g., 90% or more tin—such as tin/bismuth, eutectic tin/silver, ternary tin/silver/copper, eutectic tin/copper, and similar alloys). In another embodiment, the device-to-substrate interconnects 232 may be copper bumps or pillars. In a further embodiment, the device-to-substrate interconnects 232 may be metal bumps or pillars coated with a solder material. In still a further embodiment, the device-to-substrate interconnects 232 may be anisotropic conductive film.

The bond pads 234 may be in electrical communication with integrated circuitry (not shown) within the integrated circuit device 220. The bond pads 236 on the first surface 212 of the electronic substrate 210 may be in electrical contact with the conductive routes 218. The conductive routes 218 may extend through the electronic substrate 210 and be connected to bond pads 238 on the second surface 214 of the electronic substrate 210. As will be understood to those skilled in the art, the electronic substrate 210 may reroute a fine pitch (center-to-center distance between the bond pads) of the integrated circuit device bond pads 236 to a relatively wider pitch of the bond pads 238 on the second surface 214 of the electronic substrate 210. In one embodiment of the present description, external interconnects 240 may be disposed on the bond pads 238 on the second surface 214 of the electronic substrate 210. The external interconnects 240 may be any appropriate electrically conductive material, such as those discussed with regard to the device-to-substrate interconnects 232, as previously discussed. The external interconnects 240 may be used to attach the integrated circuit assembly 200 to an external substrate (not shown), such as a motherboard.

An electrically-insulating underfill material 242 may be disposed between the integrated circuit device 220 and the electronic substrate 210, which substantially encapsulates the device-to-interposer interconnects 232. The underfill material 242 may be used to reduce mechanical stress issues that can arise from thermal expansion mismatch between the electronic substrate 210 and the integrated circuit device 220. The underfill material 242 may be an appropriate material, including, but not limited to epoxy, cyanoester, silicone, siloxane and phenolic based resins, that has sufficiently low viscosity to be wicked between the integrated circuit device 220 and the electronic substrate 210 by capillary action when introduced by an underfill material dispenser (not shown), which will be understood to those skilled in the art. The underfill material 242 may be subsequently cured (hardened), such as by heat or radiation.

Figure 13:
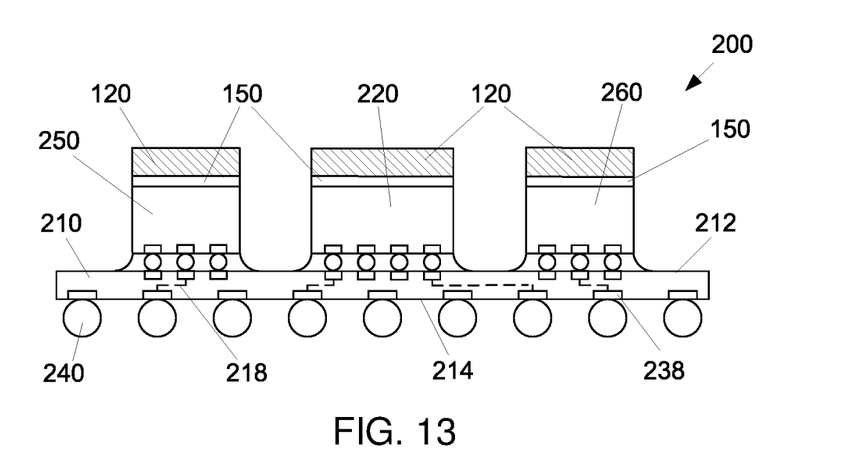
Figure 14:
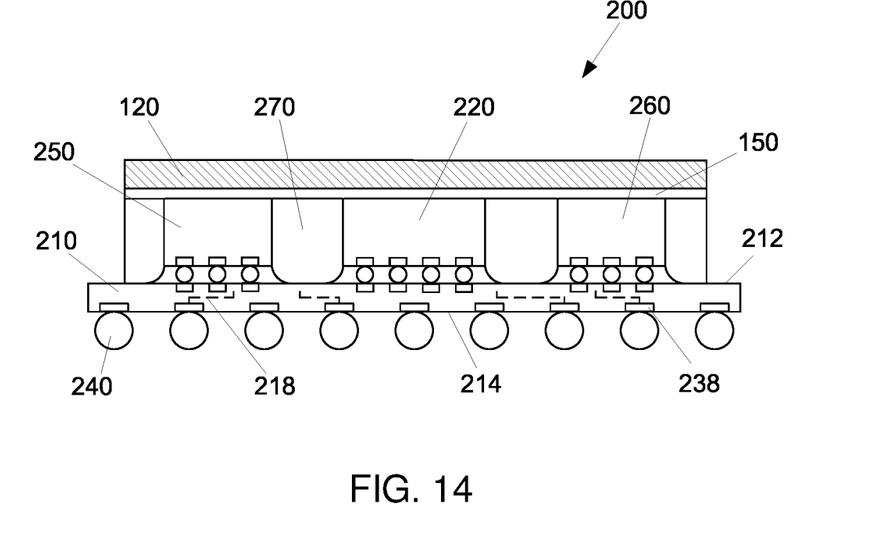
Figure 15:
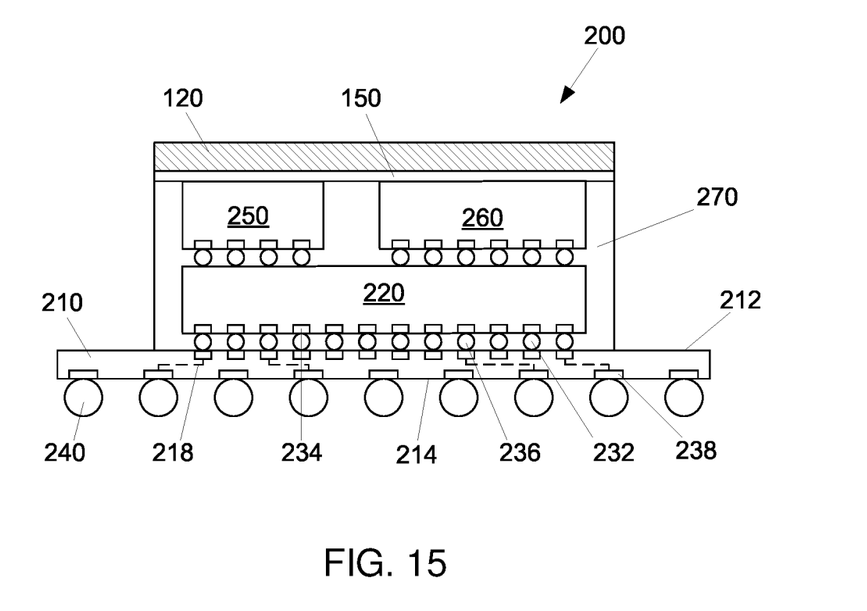

Although FIG. 12 illustrates and discusses a single integrated circuit device 220, the embodiments of the present description are not so limited. As illustrated in FIG. 13, the integrated circuit package 200 may comprise a plurality of integrated circuit devices (i.e., the integrated circuit device 220, a first additional integrated circuit device 250, and a second additional integrated circuit device 260) electrically attached to the electronic substrate 210, wherein each integrated circuit device includes individual porous mesh structures 120 formed thereon (with optional intermediate layers 150 therebetween). In another embodiment illustrated in FIG. 14, the configuration of FIG. 13 may include an encapsulation material 270 surrounding the integrated circuit device 220, the first additional integrated circuit device 250, and the second additional integrated circuit device 260, such that a single porous mesh structure 120 may span all of the integrated circuit devices (with the optional intermediate layer 150 therebetween). In still a further embodiment as shown in FIG. 15, the integrated circuit package 200 may comprise a stacked configuration, wherein the integrated circuit device 220 is electrically attached to the electronic substrate 210, and the first additional integrated circuit device 250 and the second additional integrated circuit device 260 are stacked on and electrically attached to the integrated circuit device 220. The encapsulation material 270 may surround the integrated circuit device 220, the first additional integrated circuit device 250, and the second additional integrated circuit device 260, such that a single porous mesh structure 120 may span the first additional integrated circuit device 250, and the second additional integrated circuit device 260 (with the optional intermediate layer 150 therebetween). The encapsulation material 270 may be any appropriate material, including organic and inorganic materials, such as silicon oxide, silicon nitride, metal, epoxy molding compounds, and the like.

Figure 16:
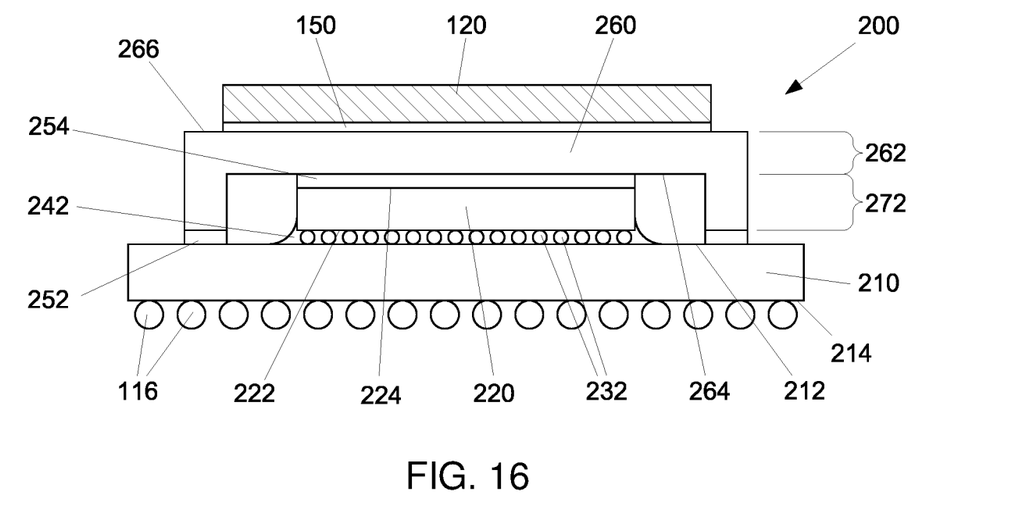
FIG. 16 is a side cross-sectional view of a porous mesh structure formed on an integrated heat spreader, according to one embodiment of the present description.

In a further embodiment of the present description, as shown in FIG. 16, the integrated circuit assembly 200 may include a heat dissipation device 260, wherein the porous mesh structure 120 is formed on the heat dissipation device 260 (with the optional intermediate layer 150 therebetween). The heat dissipation device 260 may include, but is not limited to, an integrated heat spreader (shown), a heat dissipation plate, or any such thermally conductive device, that may be thermally coupled with the second surface 224 of the integrated circuit device 220 with an internal thermal interface material 254. The heat dissipation device 260 may comprise a main body 262, having a first surface 264, an opposing second surface 266, and at least one boundary wall 272 extending from the first surface 264 of the main body 262 of the heat dissipation device 260. The at least one boundary wall 272 may be attached or sealed to the first surface 212 of the package interposer 210 with an attachment adhesive or sealant layer 252.

The heat dissipation device 260 may be made of any appropriate thermally conductive material, including, but not limited to, at least one metal material and alloys of more than one metal, or highly doped glass or highly conductive ceramic material, such as aluminum nitride. In an embodiment of the present description, the heat dissipation device 260 may comprise copper, nickel, aluminum, alloys thereof, laminated metals including coated materials (such as nickel coated copper), and the like. The internal thermal interface material 254 may be any appropriate, thermally conductive material, including, but not limited to, a thermal grease, a thermal gap pad, a polymer, an epoxy filled with high thermal conductivity fillers (such as metal particles or silicon particles), a metal alloy (such as solder or liquid metal), and the like.

As illustrated in FIG. 16, the heat dissipation device 260 may be a single material throughout, such as when the heat dissipation device 260, including the heat dissipation device boundary wall 272, is formed by a single process step, including but not limited to, stamping, skiving, molding, and the like. However, embodiments of the present description may also include the heat dissipation device 260 being made of more than one component. For example, the heat dissipation device boundary wall 272 may be formed separately from the main body 262, then attached together to form the heat dissipation device 260. In one embodiment of the present description, the boundary wall 272 may be a single "picture frame" structure surrounding the integrated circuit device 220.

The attachment adhesive 252 may be any appropriate material, including, but not limited to, silicones (such as polydimethylsiloxane), epoxies, and the like. It is understood that the boundary wall 272 not only secures the heat dissipation device 260 to the package interposer 210, but also helps to maintain a desired distance (e.g., bond line thickness) between the first surface 264 of the heat dissipation device 260 and the second surface 224 of the integrated circuit device 220.

Figure 17:
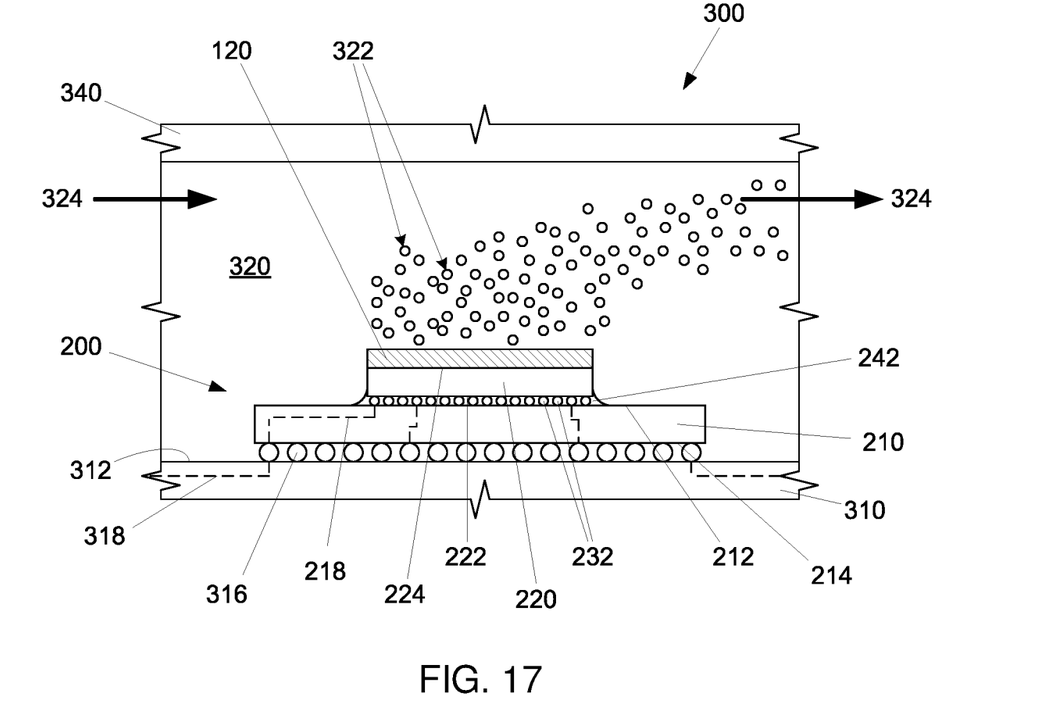
FIG. 17 is a side cross-sectional view of an immersion cooling assembly, according to one embodiment of the present description.

In still a further embodiment of the present description, as shown in FIG. 17, the integrated circuit package 200 may be incorporated into an immersion cooling assembly. As shown, the at least one integrated circuit package 200 electrically may be attached to a board substrate 310. The board substrate 310 may be any appropriate structure, including, but not limited to, a motherboard, printed circuit board, and the like. The board substrate 310 may comprise any of the materials and/or structures as discussed previously with regard to the electronic substrate 210. The board substrate 310 may further include conductive routes 318 or "metallization" (shown in dashed lines) extending through the board substrate 310, which may comprise any of the materials and/or structures as discussed previously with regard to the conductive routes 218 of the electronic substrate 210. As will be understood to those skilled in the art, the board substrate 310 may be a cored substrate or a coreless substrate.

The integrated circuit package 200 may be electrically attached to the board substrate 310 in a configuration generally known as a flip-chip or controlled collapse chip connection ("C4") configuration, according to an embodiment of the present description. In an embodiment of the present description, the electronic substrate 210 may be attached to the board substrate 310 with a plurality of substrate-to-board interconnects 316. In one embodiment of the present description, the substrate-to-board interconnects 316 may extend between bond pads (not shown) proximate a first surface 312 of the board substrate 310 and bond pads (not shown) proximate the first surface 212 of the electronic substrate 210. Although FIG. 17 shows the integrated circuit package 200 attached to the board substrate 310 with an interconnect-type attachment, the embodiments of the present description are not so limited. For example, the integrated circuit package 200 may be attached to a socket (not shown) that is electrically attached to the first surface 312 of the board substrate 310.

As further shown in FIG. 17, the integrated circuit assembly 200 may further include a working fluid, such as a dielectric low-boiling point liquid 320, in contact with the integrated circuit package 200. As illustrated, the dielectric low-boiling point liquid 320 may vaporize (shown in vapor or gas state as bubbles 322) on or in the porous mesh structure 120. For the purpose of the present application, the dielectric low-boiling point liquid 320 may be defined to be a liquid having a boiling point lower than about 60 degrees Celsius. In one embodiment of the present description, the dielectric low-boiling point liquid 320 may comprise a fluorocarbon-based fluid. In an embodiment of the present description, the dielectric low-boiling point liquid 320 may comprise fluorochemicals, including, but not limited to, perfluorohexane, perfluorocarbon, fluoroketone, hydrofluoroether (HFE), hydrofluorocarbon (HFC), hydrofluoroolefin (HFO), and the like. In another embodiment of the present description, the dielectric low-boiling point liquid 320 may comprise a perfluoroalkylmorpholine, such as 2,2,3,3,5,5,6,6-octafluoro-4-(trifluoromethyl)morpholine. As further shown in FIG. 17, the dielectric low-boiling point liquid 320 may flow (shown by arrows 324) between the board substrate 310 and an adjacent electronic substrate or fluid containment structure 340.

As will be understood to those skilled in the art, the porous mesh structure 120 may provide paths for fluid travel (e.g., by capillary action) of the dielectric low-boiling point liquid 320 and may provide nucleation sites for the evaporation or boiling of the dielectric low-boiling point liquid 320. Furthermore, as the materials used in the formation of the porous mesh structure 120 may be selected, it is possible to design the porous mesh structure 120 to optimize nucleate boiling without dry out for the particular dielectric low-boiling point liquid 320 being utilized, such as by optimizing pore size, spacing (pore-to-pore pitch), and the like.

Although the embodiment of FIG. 17 is directed to immersion cooling, it is understood that the embodiments are not so limited. Where appropriate, the embodiments of the present description may be incorporated into various heat dissipation assemblies.

Figure 18:
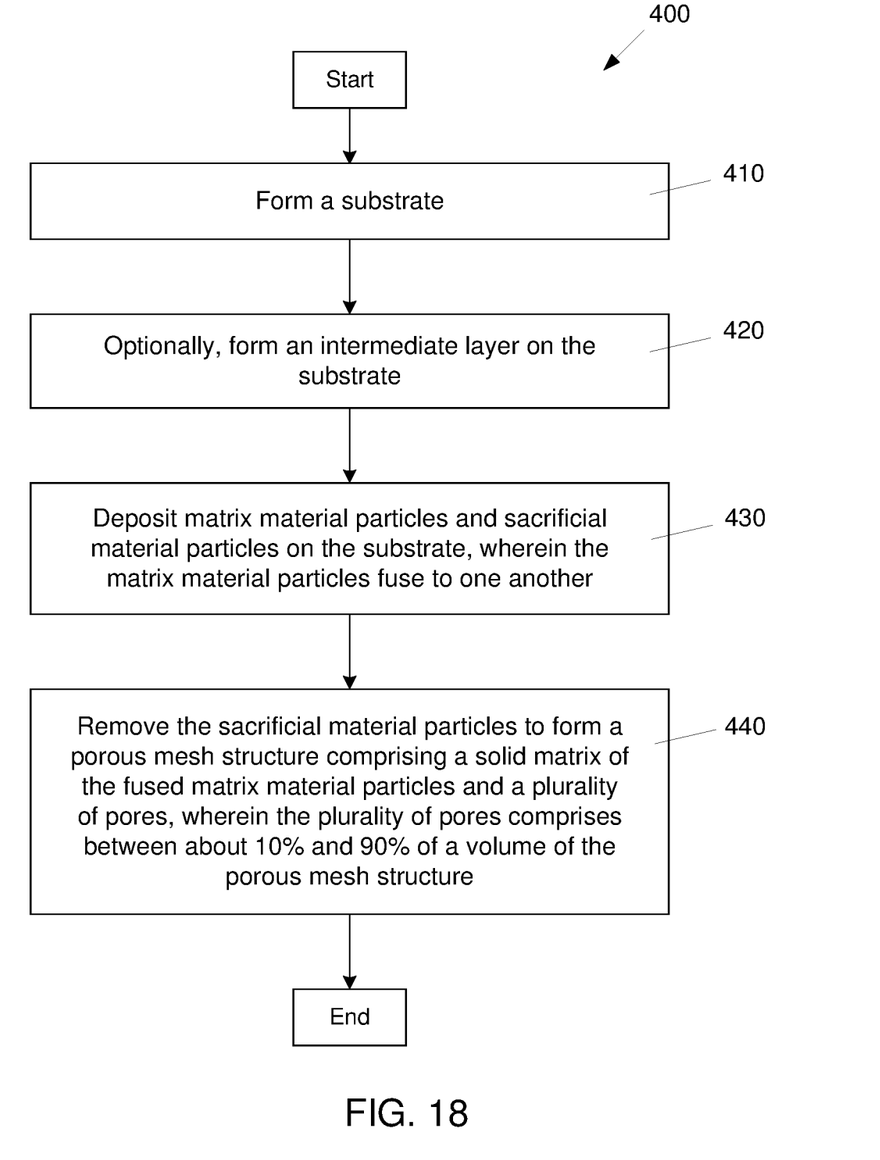
FIG. 18 is a flow diagram of a process forming a porous mesh structure, according to an embodiment of the present description.

FIG. 18 is a flow chart of a process 400 of fabricating a porous mesh structure. As set forth in block 410, a substrate may be formed. An intermediate layer 150 may be optionally formed on the substrate, as set forth in block 420. Matrix material particles and sacrificial material particles may be deposited on the substrate, wherein the matrix material particles fuse to one another, as set forth in block 430. As set forth in block 440, the sacrificial material particles may be removed to form a porous mesh structure comprising a solid matrix of the fused matrix material particles and a plurality of pores, wherein the plurality of pores comprises between about 10% and 90% of a volume of the porous mesh structure.

Figure 19:
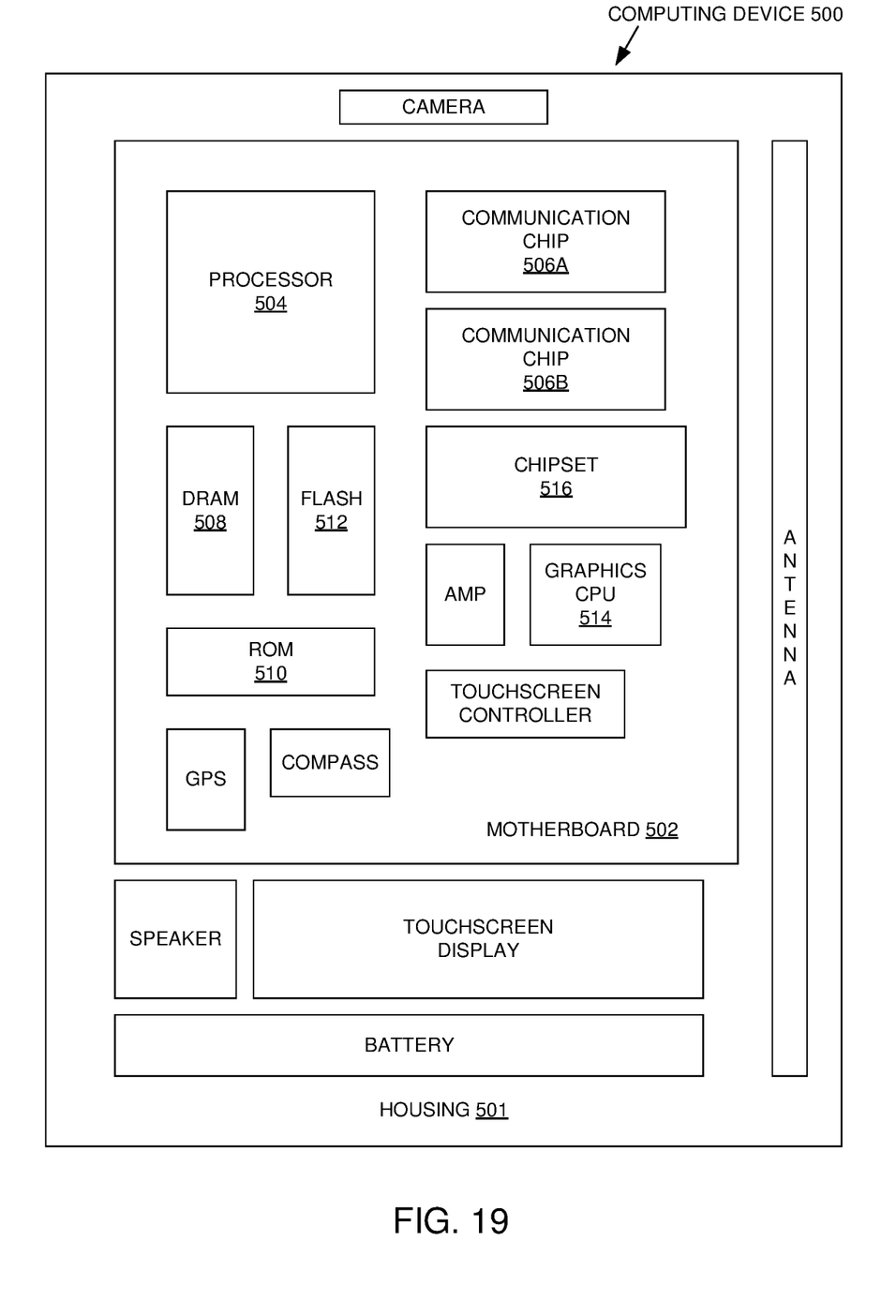
FIG. 19 is an electronic system, according to one embodiment of the present description.

FIG. 19 illustrates an electronic or computing device/system 500 in accordance with one implementation of the present description. The computing device 500 may include a housing 501 having a board 502 disposed therein. The computing device 500 may include a number of integrated circuit components, including but not limited to a processor 504, at least one communication chip 506A, 506B, volatile memory 508 (e.g., DRAM), non-volatile memory 510 (e.g., ROM), flash memory 512, a graphics processor or CPU 514, a digital signal processor (not shown), a crypto processor (not shown), a chipset 516, an antenna, a display (touch-screen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 502. In some implementations, at least one of the integrated circuit components may be a part of the processor 504.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

In one embodiment, at least one integrated circuit component of the computing device 500 may include a porous mesh structure that may comprise a solid matrix with a plurality of pores dispersed in the solid matrix, wherein the solid matrix comprises a plurality of fused matrix material particles and wherein the plurality of pores comprises between about 10% and 90% of a volume of the porous mesh structure. In a further embodiment, the entire computing device 500 or at least one of the integrated circuit components within the computing device 500 may be immersed in a two-phase immersion system, wherein the porous mesh structure acts as a nucleation site for the working fluid of the two-phase immersion system.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-19. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an apparatus, comprising a porous mesh structure including a solid matrix; and a plurality of pores dispersed in the solid matrix, wherein the solid matrix comprises a plurality of fused matrix material particles and wherein the plurality of pores comprises between about 10% and 90% of a volume of the porous mesh structure.

In Example 2, the subject matter of Example 1 can optionally include the solid matrix comprising a material selected from the group consisting of copper, aluminum, nickel, carbon, silicon carbide, and aluminum nitride.

In Example 3, the subject matter of any of Examples 1 to 2 can optionally include a substrate, wherein the porous mesh structure is disposed on the substrate.

In Example 4, the subject matter of Example 3 can optionally include the substrate comprising an integrated circuit device.

In Example 5, the subject matter of Example 3 can optionally include the substrate comprising a heat dissipation device.

In Example 6, the subject matter of any of Examples 3 to 5 can optionally include an intermediate layer between the substrate and the porous mesh structure.

In Example 7, the subject matter of Example 6 can optionally include the intermediate layer being selected from the group consisting of titanium, nickel, vanadium, gold, and nitride compounds.

Example 8 is a method, comprising forming a substrate, depositing matrix material particles and sacrificial material particles on the substrate, wherein the matrix material particles fuse to one another to form a solid matrix, and removing the sacrificial material particles to form a porous mesh structure, wherein the removal of the sacrificial material particles forms a plurality of pores, wherein the plurality of pores comprises between about 10% and 90% of a volume of the porous mesh structure. Example 1 is an apparatus, comprising a porous mesh structure including a solid matrix; and a plurality of pores dispersed in the solid matrix, wherein the solid matrix comprises a plurality of fused matrix material particles and wherein the plurality of pores comprises between about 10% and 90% of a volume of the porous mesh structure.

In Example 9, the subject matter of Example 8 can optionally include depositing the matrix particles comprising depositing a material selected from the group consisting of copper, aluminum, nickel, carbon, silicon carbide, and aluminum nitride.

In Example 10, the subject matter of any of Examples 8 and 9 can optionally include forming the substrate comprising forming an integrated circuit device.

In Example 11, the subject matter of any of Examples 8 and 9 can optionally include forming the substrate comprising forming a heat dissipation device.

In Example 12, the subject matter of any of Examples 8 to 11 can optionally include forming an intermediate layer between the substrate and the porous mesh structure.

In Example 13, the subject matter of Example 12 can optionally include forming the intermediate layer comprising forming the intermediate layer selected from the group consisting of titanium, nickel, vanadium, gold, and nitride compounds.

Example 14 is a system, comprising a board substrate and an integrated circuit assembly electrically attached to the board substrate, wherein the integrated circuit assembly comprises a substrate and a porous mesh structure on the substrate, wherein the porous mesh structure comprises a solid matrix and a plurality of pores dispersed in the solid matrix, wherein the solid matrix comprises a plurality of fused matrix material particles and wherein the plurality of pores comprises between about 10% and 90% of a volume of the porous mesh structure.

In Example 15, the subject matter of Example 14 can optionally include the solid matrix comprising a material selected from the group consisting of copper, aluminum, nickel, carbon, silicon carbide, and aluminum nitride.

In Example 16, the subject matter of Example 14 can optionally include the substrate comprising an integrated circuit device.

In Example 17, the subject matter of Example 14 can optionally include the substrate comprising a heat dissipation device.

In Example 18, the subject matter of any of Examples 14 to 17 can optionally include an intermediate layer between the substrate and the porous mesh structure.

In Example 19, the subject matter of Example 18 can optionally include the intermediate layer being selected from the group consisting of titanium, nickel, vanadium, gold, and nitride compounds.

In Example 20, the subject matter of any of Examples 14 to 19 can optionally include a working fluid in contact with the porous mesh structure.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:
1. An apparatus, comprising:
   a substrate comprising an integrated circuit (IC) device on a first side of the substrate; and
   a porous mesh structure on a second, opposite, side of the substrate, the porous mesh structure including:

a solid matrix comprising a lamellar structure of fused matrix material particles flattened to have a largest dimension non-orthogonal to the second side of the substrate; and a plurality of pores dispersed in the solid matrix, wherein the plurality of pores comprises between about 10% and 90% of a volume of the porous mesh structure.

2. The apparatus of claim 1, wherein the solid matrix comprises a material selected from the group consisting of copper, aluminum, nickel, carbon, silicon carbide, and aluminum nitride.

3. The apparatus of claim 1, wherein the pores are layered within the lamellar structure of the fused matrix material particles, and wherein the pores are flattened to have a largest dimension non-orthogonal to the second side of the substrate.

4. The apparatus of claim 3, wherein the solid matrix comprises a plurality of voids, and wherein the plurality of voids comprises no more than 2% of the volume of the solid matrix.

5. The apparatus of claim 3, wherein the pores have an average diameter of between 10 and 500 microns.

6. The apparatus of claim 3, further comprising an intermediate layer between the substrate and the porous mesh structure, wherein the intermediate layer has a thickness of no more than 500 nm.

7. The apparatus of claim 6, wherein the intermediate layer is selected from the group consisting of titanium, nickel, vanadium, gold, and nitride compounds.

8. A method, comprising:
receiving a substrate comprising an integrated circuit device on a first side of the substrate;
depositing, with a cold-spray process, matrix material particles and sacrificial material particles on a second, opposite, side of the substrate, wherein the depositing forms a lamellar structure of fused matrix and sacrificial material particles that are flattened to have a largest dimension non-orthogonal to the second side of the substrate; and
removing the sacrificial material particles to form a porous mesh structure of the fused matrix material particles, wherein the removal of the sacrificial material particles forms a plurality of pores that are flattened to have a largest dimension non-orthogonal to the second side of the substrate, wherein the plurality of pores comprises between about 10% and 90% of a volume of the porous mesh structure.

9. The method of claim 8, wherein depositing the matrix material particles comprises cold spraying a powder material selected from the group consisting of copper, aluminum, nickel, carbon, silicon carbide, and aluminum nitride at a temperature of no more than 150 degrees Celsius.

10. The method of claim 8, wherein depositing the matrix material particles and sacrificial material particles forms a plurality of voids within the lamellar structure, and wherein the plurality of voids comprises no more than 2% of the volume of the lamellar structure.

11. The method of claim 8, wherein forming the substrate comprises forming a heat dissipation device.

12. The method of claim 8, further comprising depositing an intermediate layer on the substrate before depositing the matrix material particles and sacrificial material particles.

13. The method of claim 12, wherein depositing the intermediate layer comprises forming, to a thickness of less than 500 nm, the intermediate layer from the group consisting of titanium, nickel, vanadium, gold, and nitride compounds.

14. A system, comprising:
a board substrate;
a plurality of integrated circuit devices electrically coupled to the board substrate;
an epoxy mold compound between adjacent edges of the integrated circuit devices; and
a porous mesh structure over a back side of the plurality of integrated circuit devices, wherein the porous mesh structure spans the epoxy mold compound, and comprises a solid matrix with a lamellar structure of fused matrix material particles flattened to have a largest dimension non-orthogonal to the back side of the integrated circuit devices and a plurality of pores dispersed in the solid matrix, and wherein the plurality of pores comprises between about 10% and 90% of a volume of the porous mesh structure.

15. The system of claim 14, wherein the solid matrix comprises a material selected from the group consisting of copper, aluminum, nickel, carbon, silicon carbide, and aluminum nitride.

16. The system of claim 14, wherein the pores are layered within the lamellar structure of the fused matrix material particles, and wherein the pores are flattened to have a largest dimension non-orthogonal to the back side of the substrate.

17. The system of claim 14, wherein the solid matrix comprises a plurality of voids, and wherein the plurality of voids comprises no more than 2% of the volume of the solid matrix.

18. The system of claim 14, further comprising an intermediate layer between the porous mesh structure and both of the epoxy mold compound and the back side of the plurality of integrated circuit devices.

19. The system of claim 18, wherein the intermediate layer has a thickness of no more than 500 nm and is selected from the group consisting of titanium, nickel, vanadium, gold, and nitride compounds.

20. The system of claim 14, further comprising a working fluid in contact with the porous mesh structure.

* * * * *